(12) United States Patent
Roberts et al.

(10) Patent No.: US 7,993,021 B2
(45) Date of Patent: Aug. 9, 2011

(54) MULTIPLE COLOR LIGHTING ELEMENT CLUSTER TILES FOR SOLID STATE LIGHTING PANELS

(75) Inventors: John K. Roberts, Grand Rapids, MI (US); Paul E. Sims, Pittsboro, NC (US); Chenhua You, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/601,295

(22) Filed: Nov. 17, 2006

(65) Prior Publication Data

US 2007/0115670 A1    May 24, 2007

Related U.S. Application Data

(60) Provisional application No. 60/738,305, filed on Nov. 18, 2005, provisional application No. 60/749,133, filed on Dec. 9, 2005.

(51) Int. Cl.
*G02F 1/13357* (2006.01)
*F21V 9/16* (2006.01)
*F21S 4/00* (2006.01)

(52) U.S. Cl. ............... 362/97.3; 362/231; 362/249.02; 362/249.06; 315/185 S

(58) Field of Classification Search ............ 362/231, 362/230, 249, 800, 612, 613, 555, 84–85, 362/97.1–97.4, 561, 249.02, 249.05, 249.06; 345/82, 83; 313/498, 500; 315/56–59, 185 S, 315/200 A, 312–326; 349/68, 108, 61; 257/88–89, 257/98
See application file for complete search history.

(56) References Cited

U.S. PATENT DOCUMENTS

| 4,329,625 | A | | 5/1982 | Nishizawa et al. |
| 5,767,837 | A | * | 6/1998 | Hara ............................ 345/694 |
| 5,783,909 | A | | 7/1998 | Hochstein |
| 5,803,579 | A | | 9/1998 | Turnbull et al. |
| 5,851,063 | A | | 12/1998 | Doughty et al. |

(Continued)

FOREIGN PATENT DOCUMENTS

CA        2171244        9/1996

(Continued)

OTHER PUBLICATIONS

English Abstract of French Publication WO 0060562 A1.*

(Continued)

*Primary Examiner* — Alan Cariaso
(74) *Attorney, Agent, or Firm* — Myers Bigel Sibley & Sajovec, P.A.

(57) ABSTRACT

A solid state lighting tile includes a substrate and a plurality of lighting element clusters on a surface of the substrate. Respective ones of the plurality of lighting element clusters include first and second mounting positions configured to receive solid state light emitting devices, and at least first and second ones of the solid state lighting element clusters may be electrically connected in series. The tile further includes a plurality of solid state light emitting devices configured to emit a first color light, and respective ones of the solid state light emitting devices may be mounted in respective ones of the plurality of solid state lighting element clusters. One of the first color light emitting devices is mounted in the first mounting position of the first solid state lighting element cluster and a second of the first color light emitting devices is mounted in the second mounting position of the second solid state lighting element cluster.

24 Claims, 7 Drawing Sheets

U.S. PATENT DOCUMENTS

| | | | |
|---|---|---|---|
| 5,926,238 A * | 7/1999 | Inoue et al. ............... | 349/61 |
| 5,959,316 A | 9/1999 | Lowery | |
| 6,078,148 A | 6/2000 | Hochstein | |
| 6,127,784 A | 10/2000 | Grossman et al. | |
| 6,132,072 A | 10/2000 | Turnbull et al. | |
| 6,153,985 A | 11/2000 | Grossman | |
| 6,212,213 B1 | 4/2001 | Weber et al. | |
| 6,234,648 B1 | 5/2001 | Borner et al. | |
| 6,236,331 B1 | 5/2001 | Dussureault | |
| 6,285,139 B1 | 9/2001 | Ghanem | |
| 6,350,041 B1 | 2/2002 | Tarsa et al. | |
| 6,362,578 B1 | 3/2002 | Swanson et al. | |
| 6,441,558 B1 | 8/2002 | Muthu et al. | |
| 6,495,964 B1 | 12/2002 | Muthu et al. | |
| 6,498,440 B2 | 12/2002 | Stam et al. | |
| 6,510,995 B2 | 1/2003 | Muthu et al. | |
| 6,513,949 B1 | 2/2003 | Marshall et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,576,881 B2 | 6/2003 | Muthu et al. | |
| 6,576,930 B2 | 6/2003 | Reeh et al. | |
| 6,577,073 B2 | 6/2003 | Shimizu et al. | |
| 6,630,801 B2 | 10/2003 | Schuurmans | |
| 6,636,003 B2 | 10/2003 | Rahm et al. | |
| 6,674,060 B2 | 1/2004 | Antila | |
| 6,692,136 B2 | 2/2004 | Marshall et al. | |
| 6,741,351 B2 | 5/2004 | Marshall et al. | |
| 6,784,463 B2 | 8/2004 | Camras et al. | |
| 6,809,347 B2 | 10/2004 | Tasch et al. | |
| 6,817,735 B2 | 11/2004 | Shimizu et al. | |
| 6,836,081 B2 | 12/2004 | Swanson et al. | |
| 6,841,804 B1 | 1/2005 | Chen et al. | |
| 6,841,947 B2 | 1/2005 | Berg-johansen | |
| 6,914,267 B2 | 7/2005 | Fukasawa et al. | |
| 6,936,857 B2 | 8/2005 | Doxsee et al. | |
| 7,005,679 B2 | 2/2006 | Tarsa et al. | |
| 7,008,078 B2 | 3/2006 | Shimizu et al. | |
| 7,009,343 B2 | 3/2006 | Lim et al. | |
| 7,014,336 B1 | 3/2006 | Ducharme et al. | |
| 7,023,543 B2 | 4/2006 | Cunningham | |
| 7,066,623 B2 | 6/2006 | Lee et al. | |
| 7,095,056 B2 | 8/2006 | Vitta et al. | |
| 7,135,664 B2 | 11/2006 | Vornsand et al. | |
| 7,140,752 B2 | 11/2006 | Ashdown | |
| 7,173,384 B2 | 2/2007 | Plotz et al. | |
| 7,186,000 B2 | 3/2007 | Lebens et al. | |
| 7,202,608 B2 | 4/2007 | Robinson et al. | |
| 7,208,713 B2 | 4/2007 | Ishiguchi | |
| 7,213,940 B1 | 5/2007 | Van De Ven et al. | |
| 7,256,557 B2 | 8/2007 | Lim et al. | |
| 7,281,816 B2 * | 10/2007 | Suzuki ............... | 362/231 |
| 7,358,954 B2 | 4/2008 | Negley et al. | |
| 2002/0070681 A1 | 6/2002 | Shimizu et al. | |
| 2002/0190972 A1 | 12/2002 | Van de Van | |
| 2003/0030063 A1 | 2/2003 | Sosniak et al. | |
| 2003/0052594 A1* | 3/2003 | Matsui et al. ............... | 313/495 |
| 2003/0072153 A1* | 4/2003 | Matsui et al. ............... | 362/231 |
| 2003/0089918 A1 | 5/2003 | Hiller et al. | |
| 2003/0146411 A1 | 8/2003 | Srivastava et al. | |
| 2004/0062040 A1* | 4/2004 | Blume et al. ............... | 362/231 |
| 2004/0070333 A1* | 4/2004 | Lin et al. ............... | 313/500 |
| 2004/0105261 A1 | 6/2004 | Ducharme et al. | |
| 2004/0208210 A1 | 10/2004 | Inoguchi | |
| 2004/0217364 A1 | 11/2004 | Tarsa et al. | |
| 2004/0218388 A1 | 11/2004 | Suzuki | |
| 2004/0262623 A1 | 12/2004 | You | |
| 2004/0264193 A1 | 12/2004 | Okumura | |
| 2005/0052378 A1 | 3/2005 | Hacker | |
| 2005/0082974 A1 | 4/2005 | Fukasawa et al. | |
| 2005/0117334 A1 | 6/2005 | Lee et al. | |
| 2006/0007553 A1 | 1/2006 | Bogner et al. | |
| 2006/0012989 A1 | 1/2006 | Lee | |
| 2006/0105482 A1 | 5/2006 | Alferink et al. | |
| 2007/0223219 A1 | 9/2007 | Medendorp et al. | |
| 2007/0247414 A1 | 10/2007 | Roberts | |

FOREIGN PATENT DOCUMENTS

| | | |
|---|---|---|
| DE | 196 08 898 A1 | 10/1996 |
| DE | 103 35 077 | 3/2005 |
| EP | 1 160 883 A2 | 12/2001 |
| EP | 1 462 711 | 9/2004 |
| EP | 1 583 147 A2 | 10/2005 |
| EP | A-1 583 147 | 10/2005 |
| JP | 08-30213 | 2/1996 |
| JP | 10 012926 A | 1/1998 |
| JP | 10012926 A | 1/1998 |
| JP | 10-163535 | 6/1998 |
| JP | 2002314136 A | 10/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-253309 | 9/2004 |
| JP | 2004319458 A | 11/2004 |
| JP | 2004-356116 | 12/2004 |
| JP | 2004-363055 | 12/2004 |
| JP | 200510080 A | 4/2005 |
| JP | 2005-142311 | 6/2005 |
| JP | 2007-141737 | 6/2007 |
| WO | WO 0060562 A1 * | 10/2000 |
| WO | WO 2004/032235 A | 4/2004 |
| WO | WO 2004032235 A2 | 4/2004 |
| WO | WO 2005/124877 | 12/2005 |
| WO | WO 2007/061758 A1 | 5/2007 |

OTHER PUBLICATIONS

International Search Report and Written Opinion for PCT/US2006/044566; date of mailing Mar. 29, 2007.

Van de Ven et al., "Warm White Illumination with High CRI and High Efficacy by Combining 455 nm Excited Yellowish Phosphor LED's and Red AlInGaP LED's", First International Conference on White LED's and Solid State Lighting (Nov. 26-30, 2009.

"Cree® XLamp® 7090 XR-E Series LED: Binning and Labeling", Cree, Inc., pp. 1-7 (2006).

Zhu et al., "Optimizing the Performance of Remote Phosphor LED", First International Conference on White LED's and Solid State Lighting, PW-48 (Nov. 26-30, 2007).

U.S. Appl. No. 12/248,220, filed Oct. 9, 2008, Van De Ven.

U.S. Appl. No. 12/257,804, filed Oct. 24, 2008, Negley.

Perduijn et al., "Light Output Feedback Solution for RGB LED Backlight Applications", 22 pages, SID Digest (2000).

International Search Report and Written Opinion (14 pages) corresponding to International Application No. PCT/US2008/079299; Mailing Date: Jan. 9, 2009.

Office Action corresponding to European Application No. 06837827.2, mailed Nov. 16, 2009, (4 pages).

* cited by examiner

MULTIPLE COLOR LIGHTING ELEMENT CLUSTER TILES FOR SOLID STATE LIGHTING PANELS

CROSS-REFERENCE TO RELATED APPLICATIONS

This application claims the benefit of and priority to U.S. Provisional Patent Application No. 60/738,305 entitled "SYSTEM AND METHOD FOR INTERCONNECTION AND INTEGRATION OF LED BACKLIGHTING MODULES" filed Nov. 18, 2005, and U.S. Provisional Patent Application No. 60/749,133 entitled "SOLID STATE BACKLIGHTING UNIT ASSEMBLY AND METHODS" filed Dec. 9, 2005, the disclosures of which are hereby incorporated herein by reference as if set forth in their entirety.

FIELD OF THE INVENTION

The present invention relates to solid state lighting, and more particularly to tiles and/or panels including solid state lighting components.

BACKGROUND

Solid state lighting arrays are used for a number of lighting applications. For example, solid state lighting panels including arrays of solid state lighting devices have been used as direct illumination sources, for example, in architectural and/or accent lighting. A solid state lighting device may include, for example, a packaged light emitting device including one or more light emitting diodes (LEDs). Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e. electrons and holes, in a light emitting layer or region.

Solid state lighting panels are commonly used as backlights for small liquid crystal display (LCD) display screens, such as LCD display screens used in portable electronic devices. In addition, there has been increased interest in the use of solid state lighting panels as backlights for larger displays, such as LCD television displays.

For smaller LCD screens, backlight assemblies typically employ white LED lighting devices that include a blue-emitting LED coated with a wavelength conversion phosphor that converts some of the blue light emitted by the LED into yellow light. The resulting light, which is a combination of blue light and yellow light, may appear white to an observer. However, while light generated by such an arrangement may appear white, objects illuminated by such light may not appear to have a natural coloring, because of the limited spectrum of the light. For example, because the light may have little energy in the red portion of the visible spectrum, red colors in an object may not be illuminated well by such light. As a result, the object may appear to have an unnatural coloring when viewed under such a light source.

The color rendering index of a light source is an objective measure of the ability of the light generated by the source to accurately illuminate a broad range of colors. The color rendering index ranges from essentially zero for monochromatic sources to nearly 100 for incandescent sources. Light generated from a phosphor-based solid state light source may have a relatively low color rendering index.

For large-scale backlight and illumination applications, it is often desirable to provide a lighting source that generates a white light having a high color rendering index, so that objects and/or display screens illuminated by the lighting panel may appear more natural. Accordingly, such lighting sources may typically include an array of solid state lighting devices including red, green and blue light emitting devices. When red, green and blue light emitting devices are energized simultaneously, the resulting combined light may appear white, or nearly white, depending on the relative intensities of the red, green and blue sources. There are many different hues of light that may be considered "white." For example, some "white" light, such as light generated by sodium vapor lighting devices, may appear yellowish in color, while other "white" light, such as light generated by some fluorescent lighting devices, may appear more bluish in color.

In order for a lighting source such as a display panel that includes a plurality of different-colored lighting elements, such as red, green and blue light sources, to display a consistent image, it is typically desirable for the light from the different colored lighting elements to be thoroughly mixed before it is emitted by the lighting source. However, achieving substantial mixing of light from different colored light sources may become more and more difficult as display panels are made thinner.

For larger display and/or illumination applications, multiple solid state lighting tiles may be connected together, for example, in a two dimensional array, to form a larger lighting panel. Unfortunately, however, the hue of white light generated may vary from tile to tile, and/or even from lighting device to lighting device. Such variations may result from a number of factors, including variations of intensity of emission from different LEDs, and/or variations in placement of LEDs in a lighting device and/or on a tile.

SUMMARY

A solid state lighting tile according to some embodiments of the invention includes a substrate and a plurality of light sources on a surface of the substrate. Respective ones of the plurality of light sources include first and second mounting positions configured to receive solid state light emitting devices, and at least first and second ones of the solid state light sources may be electrically connected in series. The tile further includes a plurality of solid state light emitting devices configured to emit a first color light, and respective ones of the solid state light emitting devices may be mounted in respective ones of the plurality of solid state light sources. One of the first color light emitting devices may be mounted in the first mounting position of the first solid state light source and a second of the first color light emitting devices may be mounted in the second mounting position of the second solid state light source.

The solid state lighting tile may further include a third light source connected in series with the first and second light sources. Respective ones of the light sources include a third mounting position configured to receive a solid state light emitting device, and a third of the first color light emitting devices may be mounted in the third mounting position of the third solid state light source. The first, second and third of the first color light emitting devices may be electrically connected in series.

The first mounting position of a light source may be rotationally offset from the second mounting position of the light source relative to a center of the light source.

The respective ones of the light sources include a third mounting position configured to receive a solid state light emitting device, and the third mounting position of the light source may be rotationally offset from the first and second mounting positions relative to the center of the light source.

The solid state lighting tile may further include a reflector panel on the surface of the substrate, the reflector panel including a plurality of apertures aligned with respective ones of the plurality of light sources. The reflector panel may include a diffuse reflector and may include MCPET. Respective ones of the light sources include an encapsulant dome over the solid state lighting devices.

Respective ones of the mounting positions may include a mounting pad and an electrical lead extending away from the mounting pad, and respective ones of the light sources may further include a solder mask exposing the mounting positions of the respective light sources. The encapsulant dome of a respective light source may cover the mounting pads and the electrical leads of the light source.

The solid state lighting panel may further include electrical test pads adjacent one of the light sources. The electrical test pads may be configured to permit individual testing of the light emitting devices of the one of the light sources.

The first and second light sources may be connected in series in a first path extending from a first end of the substrate to a second end of the substrate opposite from the first end, and the lighting panel may further include third and fourth light sources connected in series in a second path and extending parallel to the first string from the second end of the substrate to the first end of the substrate.

The solid state lighting tile may further include a retention hole therethrough, the retention hole being located near the center of a triangle formed by the first and second light sources in the first string and one of the third or fourth light sources of the second string.

The solid state lighting tile may further include a third solid state light source defining a triangle on the tile together with the first and second light sources. Respective ones of the first, second and third solid state light sources may include a third mounting position configured to receive a solid state light source, and a third of the first color light emitting devices may be mounted in the third mounting position of the third solid state light source. The first, second and third light sources may be arranged to form an equilateral triangle.

A solid state lighting tile according to further embodiments of the invention includes a substrate and a plurality of light sources on a surface of the substrate. Respective ones of the plurality of light sources include first, second and third mounting positions configured to receive solid state light emitting devices, a plurality of first solid state light emitting devices configured to emit a first color light, a plurality of second solid state light emitting devices configured to emit a second color light, and a plurality of third solid state light emitting devices configured to emit a third color light. Respective ones of the first, second and third solid state light emitting devices may be mounted in respective ones of the plurality of solid state light sources so that respective ones of the light sources include a first solid state light emitting device, a second solid state light emitting device, and a third solid state light emitting device. The light sources may be configured such that the mounting positions of respective first, second and third light emitting devices in the light sources are not repeated in neighboring light sources.

The first mounting position of a solid state light source may be rotationally offset from the second mounting position of the solid state light source relative to a center of the solid state light source. The third mounting position of the light source may be rotationally offset from the first and second mounting positions relative to the center of the light source.

The plurality of light sources may include a first group of light sources arranged along a first line and a second group of light sources arranged along a second line that may be parallel to the first line, and the second group of light sources may be laterally offset from the first group of light sources. In some embodiments, the second group of light sources may be offset from the first group of light sources by a distance d that is about half the spacing between adjacent ones of the light sources in the first group of light sources.

A solid state lighting tile according to still further embodiments of the invention includes a substrate and a light source on a surface of the substrate. The light source includes first and second die attach pads configured to receive solid state light emitting devices, first and second wire bond pads associated with the respective first and second die attach pads, first and second electrical traces extending away from the respective first and second die attach pads on a first side of the light source, and third and fourth electrical traces extending away from the respective first and second wire bond pads on a second side of the light source opposite the first side. The second electrical trace may be nearer a third side of the light source between the first and second sides of the light source than the first electrical trace, and the third electrical trace may be nearer the third side of the light source than the fourth electrical trace.

The light source may further include a third die attach pad configured to receive solid state a light emitting device, a third wire bond pad associated with the third die attach pad, a fifth electrical trace extending away from the third die attach pad on the first side of the light source, and a sixth electrical trace extending away from the third wire bond pads on the second side of the light source. The fifth electrical trace may be between the first and second electrical traces on the first side of the light source, and the third electrical trace may be between the fourth and sixth electrical traces on the second side of the light source.

The first die attach pad may be rotationally offset from the second die attach pad relative to a center of the light source. The third die attach pad may be rotationally offset from the first and second die attach pads relative to the center of the light source.

Methods of forming a solid state lighting tile according to some embodiments of the invention include defining a plurality of light source locations on the tile, the light source locations including first, second and third die attach pads in first, second and third mounting positions, respectively, mounting a first light emitting device configured to emit a first color of light in a first mounting position of a first light source location, and mounting a second light emitting device configured to emit a color of light different than the first color of light in the first mounting position of a second light source location neighboring the first light source location. Defining the light source locations may include arranging the light source in an array of triangles on the tile.

The methods may further include mounting a third light emitting device configured to emit the first color of light in a mounting position of the second light source location other than the first mounting position. The first, second and third mounting positions of respective light source locations may be rotationally offset from one another.

The methods may further include forming a retention hole positioned at the center of one of the triangles of the array of triangles. The methods may further include connecting the first light emitting device in series with the third light emitting device.

A solid state lighting tile according to further embodiments of the invention includes a plurality of lighting element clusters on a surface of the tile. Each of the lighting element clusters is configured to receive a plurality of different color LEDs, and at least two of the lighting element clusters are configured to receive the different color LEDs at different mounting positions therein.

Each of the lighting element clusters may include first and second mounting positions. The first mounting position of a lighting element cluster may be rotationally offset from the second mounting position of the lighting element cluster relative to a center of the lighting element cluster.

Each of the lighting element clusters may include a third mounting position configured to receive a solid state light emitting device, and the third mounting position of the lighting element cluster may be rotationally offset from the first and second mounting positions relative to the center of the lighting element cluster.

Other apparatus and/or methods according to embodiments of the invention will be or become apparent to one with skill in the art upon review of the following drawings and detailed description. It is intended that all such additional apparatus and/or methods be included within this description, be within the scope of the present invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
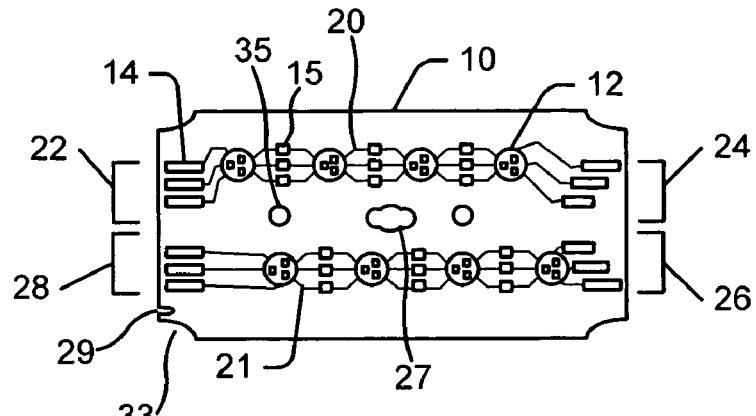
FIG. 1 is a top view of a solid state lighting tile in accordance with some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The present invention is described below with reference to flowchart illustrations and/or block diagrams of methods, systems and computer program products according to embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Referring now to FIG. 1, a solid state lighting tile 10 may include thereon a number of solid state lighting element clusters 12 arranged in a regular and/or irregular two dimensional array. The tile 10 may include, for example, a printed circuit board (PCB) on which one or more circuit elements may be mounted. In particular, a tile 10 may include a metal core PCB (MCPCB) including a metal core having thereon a polymer coating on which patterned metal traces (not shown) may be formed. MCPCB material, and material similar thereto, is commercially available from, for example, The Bergquist Company. The PCB may further include heavy clad (4 oz. copper or more) and/or conventional FR-4 PCB material with thermal vias. MCPCB material may provide improved thermal performance compared to conventional PCB material. However, MCPCB material may also be heavier than conventional PCB material, which may not include a metal core.

In the embodiments illustrated in FIG. 1, the lighting element clusters 12 are multi-chip clusters of three solid state emitting devices per cluster. In the tile 10, three lighting element clusters 12 are serially arranged in a first path 20, while three lighting element clusters 12 are serially arranged in a second path 21. The lighting element clusters 12 of the first path 20 are connected, for example via printed circuits, to a set of three anode contacts 22 arranged at a first end of the tile 10, and a set of three cathode contacts 24 arranged at a second end of the tile 10. The lighting element clusters 12 of the second path 21 are connected to a set of three anode contacts 26 arranged at the second end of the tile 10, and a set of three cathode contacts 28 arranged at the first end of the tile 10. The tile 10 may further include electrical test pads 15 between the lighting element clusters 12. The electrical test pads 15 are configured to permit individual testing of the light emitting devices of the lighting element clusters 12.

A locking feature 27 is disposed approximately in the center of the tile 10. In particular, the locking feature 27 may include an aperture in tile 10 that may receive a twist-locking mechanism therethrough.

An alignment notch 29 may be provided in the tile 10 to assist connection of an edge connector (not shown). Furthermore, notches 33 may be provided in the corners of the tiles 10 to avoid contact between the reflector panel 40 and/or tile 10 and the screws of a substrate board and/or bar on which the tile 10 is mounted. The tile 10 may further include one or more automation indexing holes (not shown) that may be used to move the tile during automated manufacturing steps.

One or more retention holes 35 may also be present in the tile 10, as shown in FIG. 1. The retention holes 35 may be used to align a reflector panel 40 (FIG. 5) with the tile 10. The reflector panel 40 and the tile 10 may be fastened together using, for example, push pins, snaps, screws, and/or any other retention mechanism. In some embodiments, the reflector panel 40 and the tile 10 may be fastened together using double-sided adhesive tape or other adhesive means.

Figure 2:
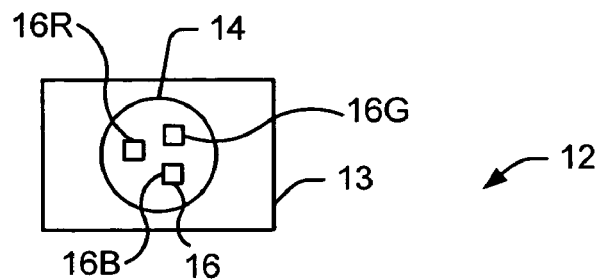
FIG. 2 is a top view of a solid state light source including a plurality of solid state light emitting devices (LEDs) in accordance with some embodiments of the invention.

The solid state lighting element clusters 12 may include, for example, organic and/or inorganic light emitting devices. An example of a solid state lighting element cluster 12 for high power illumination applications is illustrated in FIG. 2. A solid state lighting element cluster 12 may include a packaged discrete electronic component including a carrier substrate 13 on which a plurality of LED chips 16 are mounted. In other embodiments, one or more solid state lighting element clusters 12 may include LED chips 16 mounted directly onto electrical traces on the surface of the tile 10, forming a multi-chip module or chip on board assembly.

The LED chips 16 may include at least a red LED 16R, a green LED 16G and a blue LED 16B. The blue and/or green LEDs may be InGaN-based blue and/or green LED chips available from Cree, Inc., the assignee of the present invention. The red LEDs may be, for example, AlInGaP LED chips available from Epistar, Osram and others. The lighting device 12 may include an additional green LED in order to make more green light available.

In some embodiments, the LEDs 16 may have a square or rectangular periphery with an edge length of about 900 µm or greater (i.e. so-called "power chips." However, in other embodiments, the LED chips 16 may have an edge length of 500 µm or less (i.e. so-called "small chips"). In particular, small LED chips may operate with better electrical conversion efficiency than power chips. For example, green LED chips with a maximum edge dimension less than 500 microns and as small as 260 microns, commonly have a higher electrical conversion efficiency than 900 micron chips, and are known to typically produce 55 lumens of luminous flux per Watt of dissipated electrical power and as much as 90 lumens of luminous flux per Watt of dissipated electrical power.

As further illustrated in FIG. 2, the LEDs 16 may be covered by an encapsulant dome 14, which may be clear and/or may include light scattering particles, phosphors, and/or other elements to achieve a desired emission pattern, color and/or intensity. While not illustrated in FIG. 2, the lighting element cluster 12 may further include a reflector cup surrounding the LEDs 16, a lens mounted above the LEDs 16, one or more heat sinks for removing heat from the lighting device, an electrostatic discharge protection chip, and/or other elements.

Figure 3:
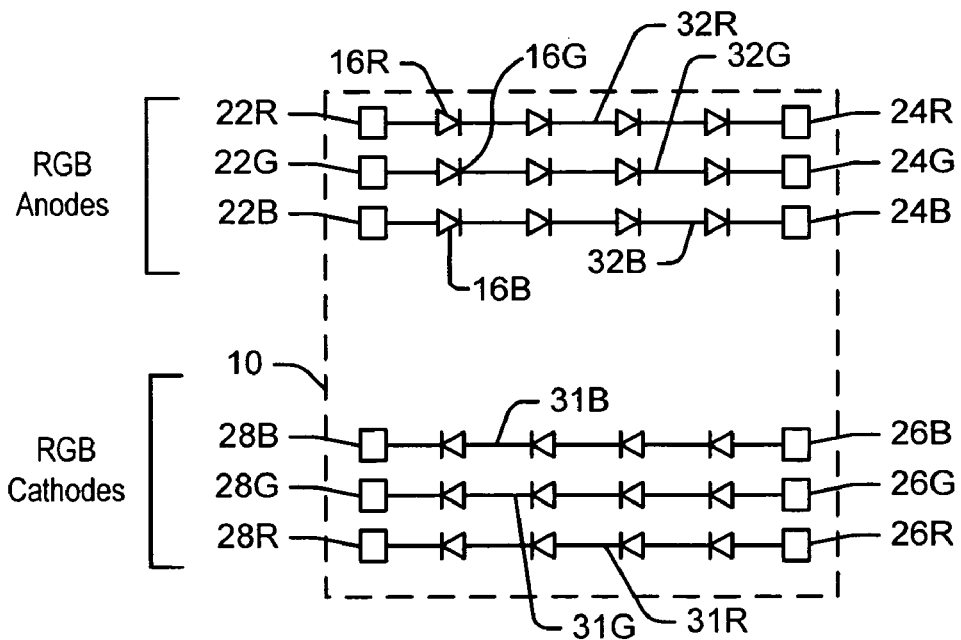
FIG. 3 is a schematic circuit diagram illustrating the electrical interconnection of LEDs in a solid state lighting tile in accordance with some embodiments of the invention.

LED chips 16 of the lighting element clusters 12 in the tile 10 may be electrically interconnected as shown in the schematic circuit diagram in FIG. 3. As shown therein, the LEDs may be interconnected such that the blue LEDs 16B in the first path 20 are connected in series to form a string 32B. Likewise, the green LEDs 16G in the first path 20 may be arranged in series to form a string 32G. The red LEDs 16R may be arranged in series to form a string 32R. Each string 32R, 32G, 32B may be connected to a respective anode contact 22R, 22G, 22B arranged at a first end of the tile 10 and a cathode contact 24 arranged at the second end of the tile 10, respectively.

A string 32R, 32G, 32B may include all, or less than all, of the corresponding LEDs in the first path 20. For example, the string 32B may include all of the blue LEDs 16B from all of the lighting element clusters 12 in the first path 20. Alternatively, a string 32R, 32G, 32B may include only a subset of the corresponding LEDs in the first path 20. Accordingly the first path 20 may include three serial strings 32R, 32G, 32B arranged in parallel on the tile 10.

The second path 21 on the tile 10 may include three serial strings 31R, 31G, 31B arranged in parallel. The strings 31R, 31G, 31B are connected to anode contacts 26R, 26G, 26B, which are arranged at the second end of the tile 10 and to cathode contacts 28R, 28G, 28B, which are arranged at the first end of the tile 10, respectively.

It will be appreciated that, while the embodiments illustrated in FIGS. 1-3 include three LED chips 16 per lighting device 12 which are electrically connected to form at least three strings of LEDs 16 per path 20, 21, more and/or fewer than three LED chips 16 may be provided per lighting device 12, and more and/or fewer than three LED strings may be provided per path 20, 21 on the tile 10. For example, a lighting device 12 may include only one green LED chip 16G, in which case the LEDs may be connected to form three strings per path 20, 21. Likewise, in some embodiments, the two green LED chips in a lighting device 12 may be connected in series to one another, in which case there may only be a single string of green LED chips per path 20, 21. Further, a tile 10 may include only a single path 20 instead of plural paths 20, 21 and/or more than two paths 20, 21 may be provided on a single tile 10.

Figure 4A:
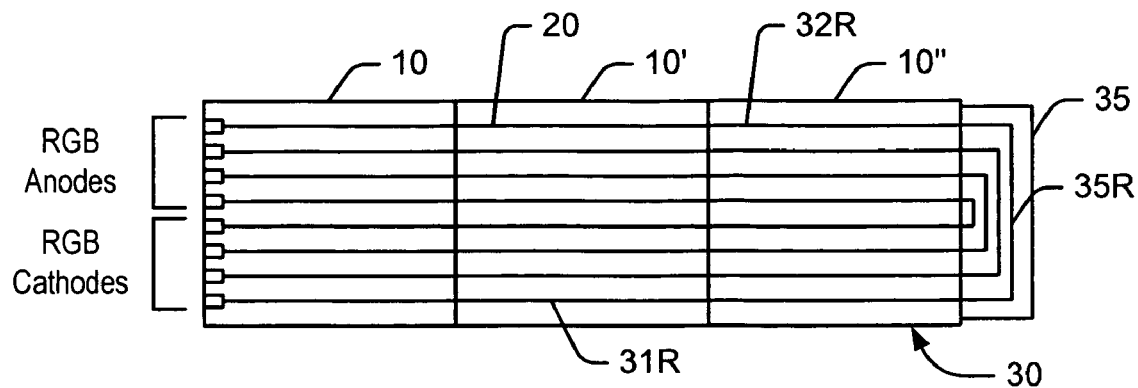
FIG. 4A is a top view of a bar assembly including multiple solid state lighting tiles in accordance with some embodiments of the invention.

Multiple tiles 10 may be assembled to form a larger lighting bar assembly 30 as illustrated in FIG. 4A. As shown therein, a bar assembly 30 may include two or more tiles 10, 10', 10" connected end-to-end. Accordingly, referring to FIGS. 3 and 4, the cathode contacts 24 of the first path 20 of the leftmost tile 10 may be electrically connected to the anode contacts 22 of the first path 20 of the central tile 10', and the cathode contacts 24 of the first path 20 of the central tile 10' may be electrically connected to the anode contacts 22 of the first path 20 of the rightmost tile 10", respectively. Similarly, the anode contacts 26 of the second path 21 of the leftmost tile 10 may be electrically connected to the cathode contacts 28 of the second path 21 of the central tile 10', and the anode contacts 26 of the second path 21 of the central tile 10' may be electrically connected to the cathode contacts 28 of the second path 21 of the rightmost tile 10", respectively.

Furthermore, the cathode contacts 24 of the first path 20 of the rightmost tile 10" may be electrically connected to the anode contacts 26 of the second path 21 of the rightmost tile 10" by a loopback connector 35. For example, the loopback connector 35 may electrically connect the cathode 24R of the string 32R of red LED chips 16R of the first path 20 of the rightmost tile 10" with the anode 26R of the string 31R of red LED chips of the second path 21 of the rightmost tile 10". In this manner, the string 32R of the first path 20 may be connected in serial with the string 31R of the second path 21 by a conductor 35R of the loopback connector 35 to form a single string of red LED chips 16R. The other strings of the paths 20, 21 of the tiles 10, 10', 10" may be connected in a similar manner.

The loopback connector 35 may include an edge connector, a flexible wiring board, or any other suitable connector. In addition, the loop connector may include printed traces and/or wire loops formed on/in the tile 10.

While the bar assembly 30 shown in FIG. 4A is a one dimensional array of tiles 10, other configurations are possible. For example, the tiles 10 could be connected in a two-dimensional array in which the tiles 10 are all located in the same plane, or in a three dimensional configuration in which the tiles 10 are not all arranged in the same plane. Furthermore the tiles 10 need not be rectangular or square, but could, for example, be hexagonal, triangular, or the like.

Figure 4B:
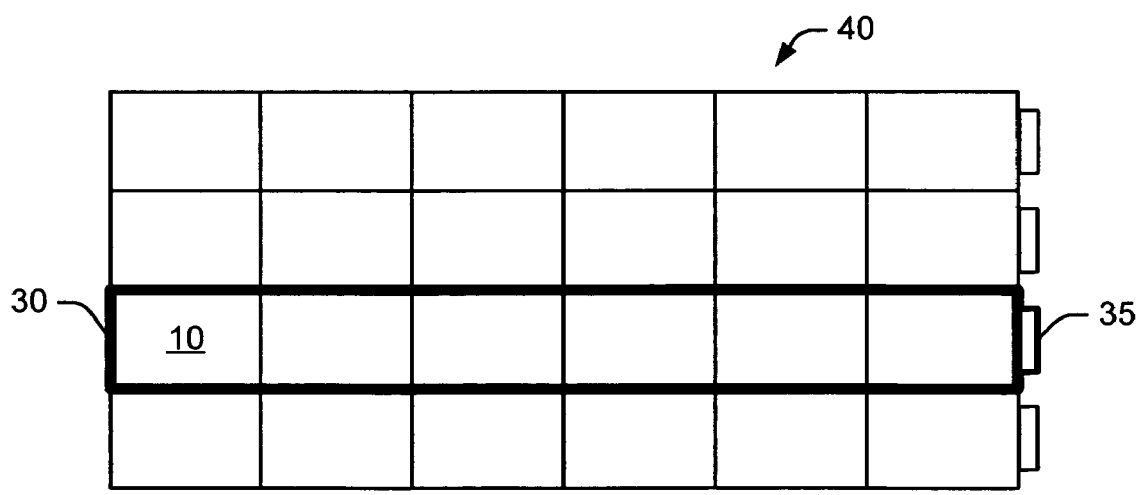
FIG. 4B is a top view of a lighting panel in accordance with some embodiments of the invention including multiple bar assemblies.

Referring to FIG. 4B, in some embodiments, a plurality of bar assemblies 30 may be combined to form a lighting panel 40, which may be used, for example, as a backlighting unit (BLU) for an LCD display. As shown in FIG. 4B, a lighting panel 40 may include four bar assemblies 30, each of which includes six tiles 10. The rightmost tile 10 of each bar assembly 30 includes a loopback connector 35. Accordingly, each bar assembly 30 may include three strings of LEDs (i.e. one red, one green and one blue).

In some embodiments, a bar assembly 30 may include three LED strings (one red, one green and one blue). Thus, a lighting panel 40 including nine bar assemblies may have 27 separate strings of LEDs. Moreover, in a bar assembly 30 including six tiles 10 with eight solid state lighting element clusters 12 each, an LED string may include 48 LEDs connected in series.

Figure 5:
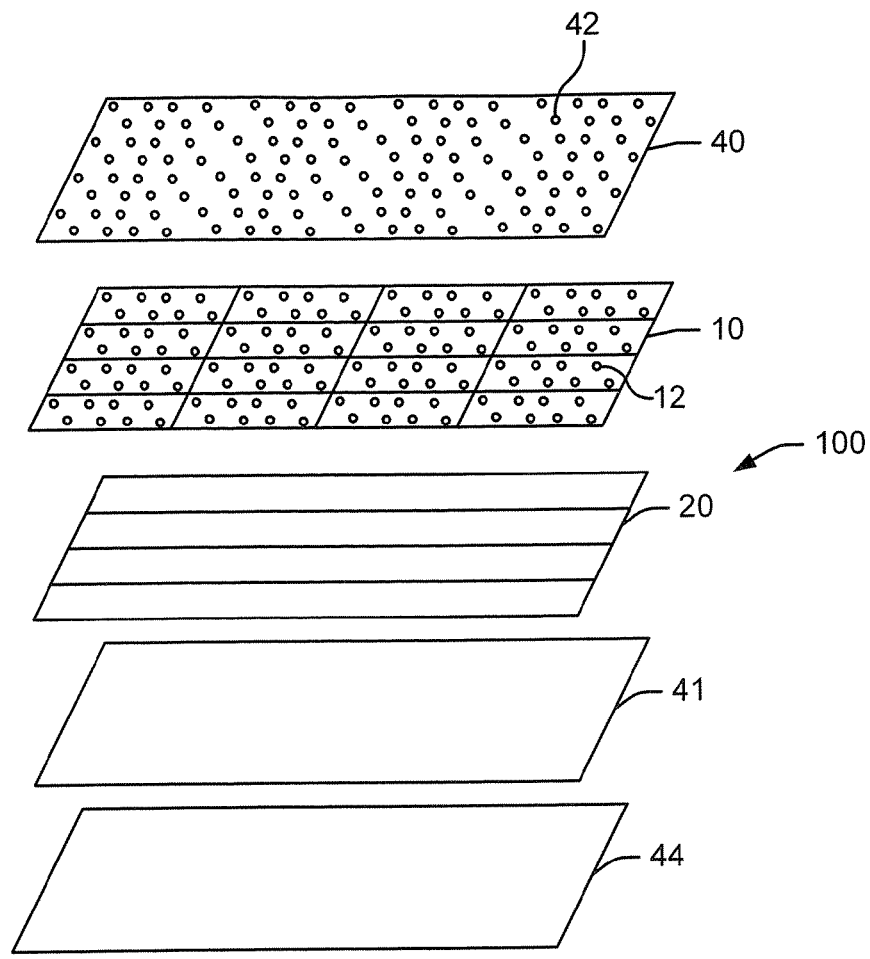
FIG. 5 is an exploded perspective view of a solid state lighting panel including a solid state lighting tile according to some embodiments of the invention.

A backlight assembly 100 is shown in exploded perspective view in FIG. 5. As shown therein, a backlight assembly 100 may include a plurality of tiles 10 having lighting element clusters 12 thereon arranged in a two dimensional array. The tiles 10 are mounted on corresponding bars 20, which may be mounted for support on a cover bottom 44, which may include a metal plate. It will be appreciated that, in some embodiments, the tiles 10 may be mounted directly on the cover bottom 44. A reflector panel 40 including a plurality of apertures 42 therethrough is mounted above the tiles such that the apertures 42 may align with respective lighting element clusters 12 on the tiles 10.

An optional thermal spacer, such as a graphite thermal spacer 41, may be provided between the cover bottom 44 and the bars 20. The thermal spacer 41 may include, for example, an anisotropic carbon spreader such as the Spreadershield available from Graphtec International, Ltd., of Cleveland, Ohio. The thermal spacer 41 may help disperse residual thermal nonuniformities in the system. The thermal spacer 41 may be held in place by compression force between the cover bottom 44 and the bars 20. Alternatively or additionally, the thermal spacer 41 may be pre-installed in the cover bottom 44 held in place using, for example, a two-sided pressure sensitive adhesive tape until final assembly.

The tiles 10 may be affixed to respective bars 20, for example, by means of an adhesive. In some embodiments, the adhesive may be a thermally conductive, pressure sensitive adhesive to provide a thermally conductive interface between the bars 20 and the tiles 10. The entire assembly may be fastened together, for example, by means of mechanical fasteners (not shown).

Figure 6:
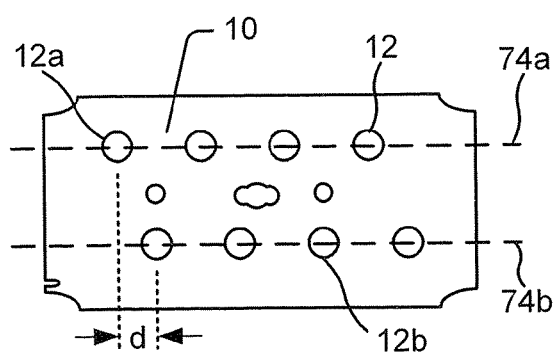
FIG. 6 is a top view of a solid state lighting tile in accordance with some embodiments of the invention.

Some further aspects of a tile 10 according to embodiments of the invention are illustrated in FIG. 6. The tile 10 includes a plurality of lighting element clusters 12 arranged thereon, including a first plurality of series-connected lighting element clusters 12a extending from a first end of the tile 10 to a second end of the tile 10 along a first line 74a and a second plurality of series-connected lighting element clusters 12b extending from a first end of the tile 10 to a second end of the tile 10 along a second line 74b and offset by a distance d from the first plurality of lighting element clusters 12a. The distance d may be about half the distance between adjacent ones of the first plurality of lighting element clusters 12a and/or the second plurality of lighting element clusters 12b such that the lighting element clusters 12 form an array of triangles across the tile 10.

Figure 7:
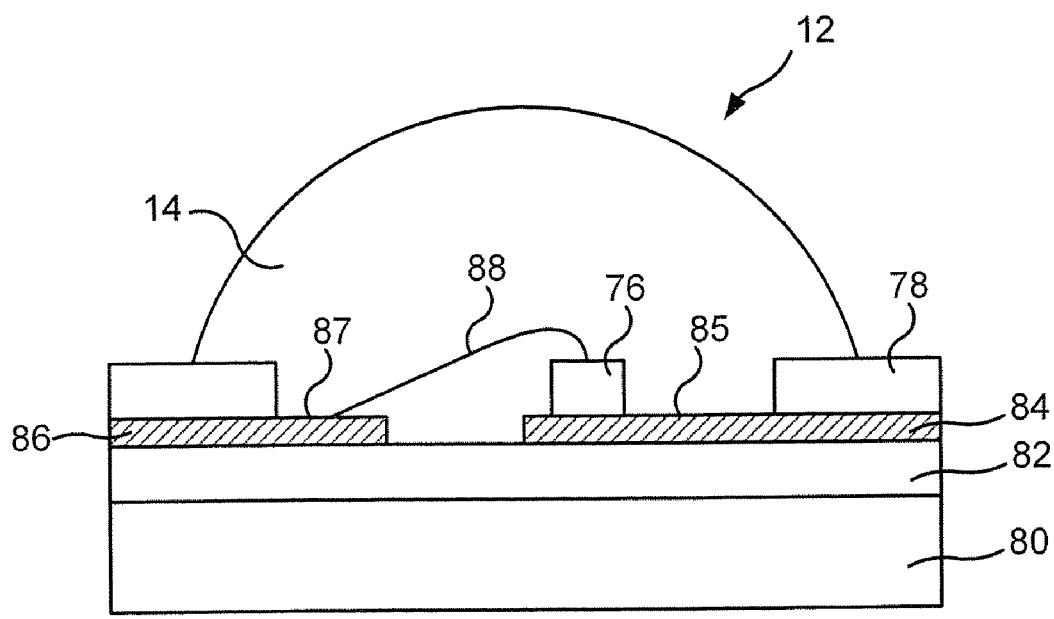
FIG. 7 is a partial cross sectional view of a solid state lighting tile including a light source according to some embodiments of the invention.

A lighting element cluster 12 is shown in more detail in the partial cross-section of FIG. 7. The lighting element cluster 12 is formed on a tile substrate that may include a dielectric layer 82 on a metal board 80. A first electrical trace 84 acts as both an electrical connector and as a mounting pad for a solid state light emitting device (LED) 76. In particular, the first electrical trace 84 is generally covered with a solder mask 78 that provides electrical isolation and/or physical protection for the first electrical trace 84. However, the solder mask 78 is patterned to expose a portion 85 of the first electrical trace 84 that may be used as a die attach pad. Similarly, the solder mask 78 is patterned to expose a portion 87 of a second electrical trace 86 that can act as a wirebond pad.

As further illustrated in FIG. 7, in some embodiments of the invention, a contact of the LED 76 is wire bonded to the wirebond pad 87 of the second electrical trace 86 via a wirebond connection 88. However, it will be appreciated that the wirebond connection 88 may not be necessary if the LED 76 is a horizontal device mounted in flip-chip configuration. That is, if the LED 76 has both anode and cathode contacts on a same side of the device and is mounted with contacts down and bonded to the respective first and second electrical traces 84, 86. Similarly, the LED 76 may be mounted on a submount (not shown) that may provide anode and cathode contacts on a same side thereof. Wirebonds also may not be needed in other configurations. Wirebond connections may be desirable, however, as they may provide the ability to create crossover connections, as described below.

Figure 8:
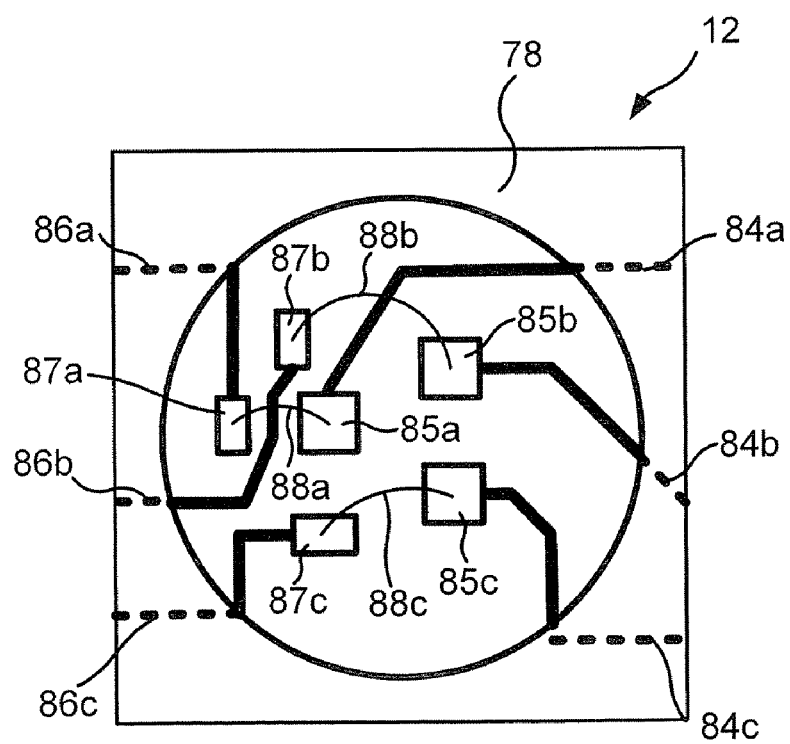
FIG. 8 is a top view of a light source configured according to some embodiments of the invention.

The lighting element cluster 12 may include more than one pair of die attach/wirebond pads to accommodate more than one LED 76, as illustrated in FIG. 8, which is a plan view of a lighting element cluster 12. As shown therein, a lighting element cluster 12 may include a plurality of die attach pads 85a-c from which a plurality of respective first electrical traces 84a-c extend away from the lighting element cluster 12. The lighting element cluster 12 further includes a plurality of wirebond pads 87a-c from which a plurality of respective second electrical traces 86a-c extend away from the lighting element cluster 12. Wirebond connections 88a-c connect LEDs (not shown) on the die attach pads 85a-c to the wirebond pads 87a-c. One or more of the wirebonds, such as wirebonds 88a, 88b, may provide crossover connections that cross over one or more electrical traces in the lighting element cluster 12.

In FIG. 8, portions of the electrical traces 84a-c and 86a-c covered by the solder mask 78 are illustrated in broken lines, while portions of the electrical traces 84a-c and 86a-c exposed by the solder mask 78 are illustrated in solid lines.

The die attach pads 85a-c provide a plurality of LED mounting positions in the lighting element cluster 12. For example, as seen in FIG. 8, the die attach pads 85a-c can be arranged in a triangle having respective first, second and third mounting positions located at about the 9 o'clock, 1 o'clock and 5 o'clock positions, respectively, relative to the center of the lighting element cluster 12. Other numbers and arrangements of mounting positions are possible, however. As can be further seen in FIG. 8, the electrical traces 84a, 86a extending from the die attach pad 85a and wirebond pad 87a may be arranged across the lighting element cluster 12 from each other, so that, in relation to the orientation of FIG. 8, the first electrical trace 84a is above the first electrical trace 84b, which is in turn above the first electrical trace 84c, while the second electrical trace 86a is above the second electrical trace 86b, which is in turn above the second electrical trace 86c. Thus, the first electrical trace is 84a is across the lighting element cluster 12 from the second electrical trace 86a, the first electrical trace is 84b is across the lighting element cluster 12 from the second electrical trace 86b, and the first electrical trace is 84c is across the lighting element cluster 12 from the second electrical trace 86c.

Figure 9:
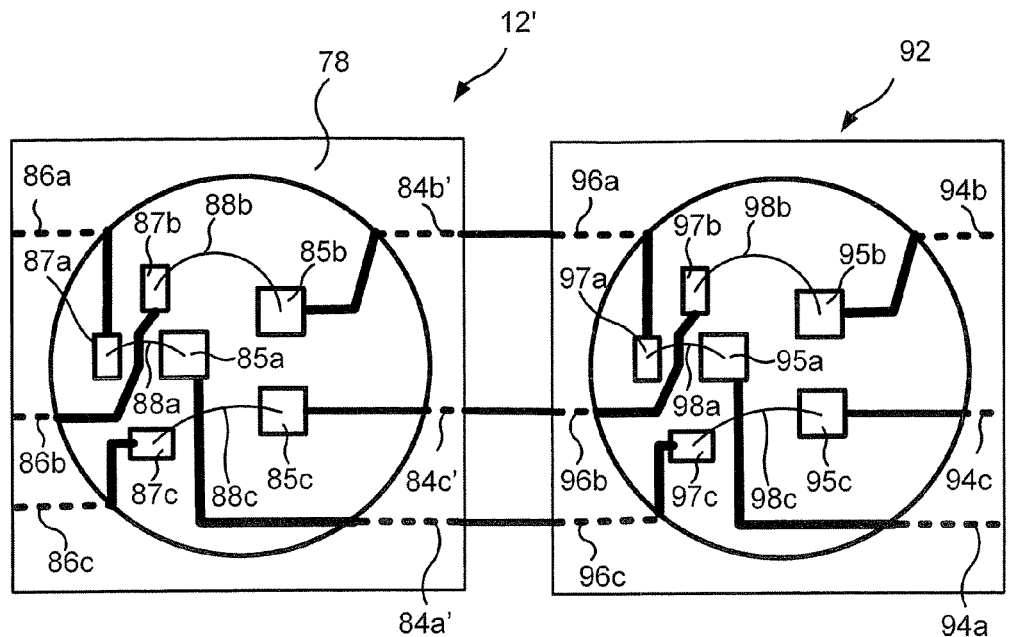
FIG. 9 is a top view of a pair of light sources configured according to further embodiments of the invention.

In some embodiments, however, the electrical traces may be arranged such that the electrical traces on one side of the light source are re-oriented with respect to the electrical traces on the other side of the light source. For example, as shown in FIG. 9, in a lighting element cluster 12', the first electrical trace 84b' may be above the first electrical trace 84c', which may be above the first electrical trace 84a'. This configuration may facilitate the placement of series connected same-color LEDs 76 in different mounting positions in adjacent lighting element clusters 12' on a tile 10, as explained in greater detail below.

A second light source 92 is connected in series with the lighting element cluster 12'. The second light source 92 includes first, second and third die mounting pads 95a, 95b and 95c and associated wirebond pads 97a, 97b and 97c. Wirebond connections 98a-c connect LEDs (not shown) on the die attach pads 95a-c to the wirebond pads 97a-c. A first set of electrical traces 94a, 94b and 94c extend from respective ones of the die mounting pads 95a, 95b, 95c at a first side of the second light source 92. The second light source 92 further includes a second set of electrical traces 96a, 96b and 96c that extend from respective ones of the wire bond pads 97a, 97b and 97c toward the second side of the second light source 92.

As shown in FIG. 9, the electrical trace 84b' of the lighting element cluster 12' is connected to the electrical trace 96a of the second light source 92 such that an LED mounted on the second die attach pad 85b may be connected in series with an LED mounted on the first die attach pad 95a of the second light source 92. Similarly, the electrical trace 84c' of the lighting element cluster 12' is connected to the electrical trace 96b of the second light source 92 such that an LED mounted on the third die attach pad 85c may be connected in series with an LED mounted on the second die attach pad 95b of the second light source 92. Likewise, the electrical trace 84a' of the lighting element cluster 12' is connected to the electrical trace 96c of the second light source 92 such that an LED mounted on the first die attach pad 85a may be connected in series with an LED mounted on the third die attach pad 95c of the second light source 92. In this manner, LEDs mounted at different mounting positions of adjacent light sources may be easily connected in series.

Figure 10:
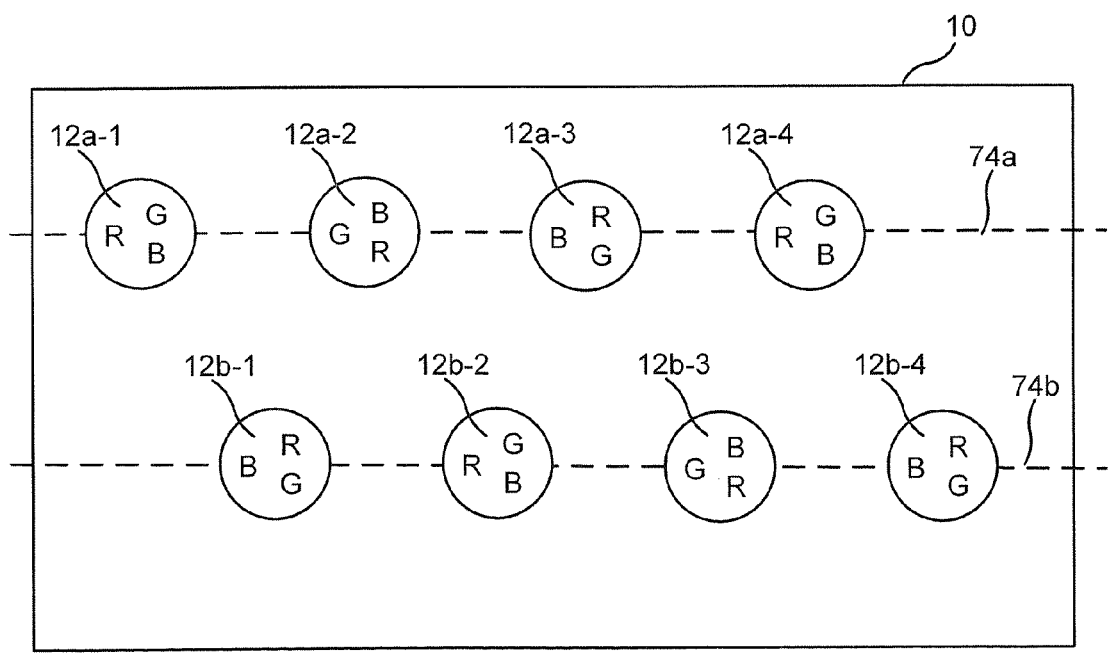
FIG. 10 is a top view of a solid state lighting tile in accordance with some embodiments of the invention.

Referring to FIG. 10, a tile 10 includes a first row of series-connected lighting element clusters 12a-1 to 12a-4 arranged along a first line 74a and a second row of series-connected lighting element clusters 12b-1 to 12b-4 arranged along a second line 74b. Each of the lighting element clusters 12a-1 to 12a-4 and 12b-1 to 12b-4 includes three mounting positions located at about the 9 o'clock, 1 o'clock and 5 o'clock positions of the lighting element clusters 12, respectively. Red, green and blue LEDs may be mounted in each of the lighting element clusters 12a-1 to 12a-4 and 12b-1 to 12b-4. Same color LEDs in a line 74a, 74b are electrically connected in series to form a string of LEDs. However, each LED is mounted in a different mounting position from the same color LED in adjacent lighting element clusters 12. For example, in the lighting element cluster 12a-1, the red LED is mounted in the first mounting position, as indicated by the letter R at the first mounting position of the lighting element cluster 12a-1. Likewise, the green LED, as indicated by the letter G, is mounted in the second mounting position of the lighting element cluster 12a-1, while the blue LED is mounted at the third mounting position, as indicated by the letter B.

In the adjacent lighting element cluster 12a-2 in the same line 74a, the red LED is mounted in the third mounting position, while the green LED is mounted in the first mounting position and the blue LED is mounted in the second mounting position. Continuing on, in the next lighting element cluster 12a-3 in the first line 74a, the red LED is mounted in the second mounting position, while the green LED is mounted in the third mounting position and the blue LED is mounted in the first mounting position.

Similarly, the LEDs in neighboring light sources in adjacent lines may be mounted in different mounting positions.

For example, the mounting positions of the LEDs in the lighting element cluster 12b-1 in the second line 74b are different from the mounting positions of the neighboring LEDs in the lighting element clusters 12a-1 and 12a-2 in the first line 74a.

More generally, the lighting element clusters 12 may be configured such that the mounting positions of LEDs in the light sources are not repeated in the neighboring light sources. For example, in the lighting element cluster 12b-2, the red LED is located in the first mounting position, while in each of the light sources neighboring the lighting element cluster 12b-2 (namely, lighting element clusters 12b-1, 12a-2, 12a-3 and 12b-3), a blue or green LED is located in the first mounting position.

The color uniformity of the tile 10 may be improved by placing same color LEDs in different mounting positions in adjacent lighting element clusters 12. For example, LEDs mounted in different mounting positions may have different emission patterns due to lensing, shadowing, reflection, and/or other optical effects. Thus, by alternating the mounting positions of different colored LEDs, the effects of lensing, shadowing, reflection, and/or other optical effects may be distributed across all of the constituent colors produced by the lighting element clusters 12 on the tile 10.

Figure 11:
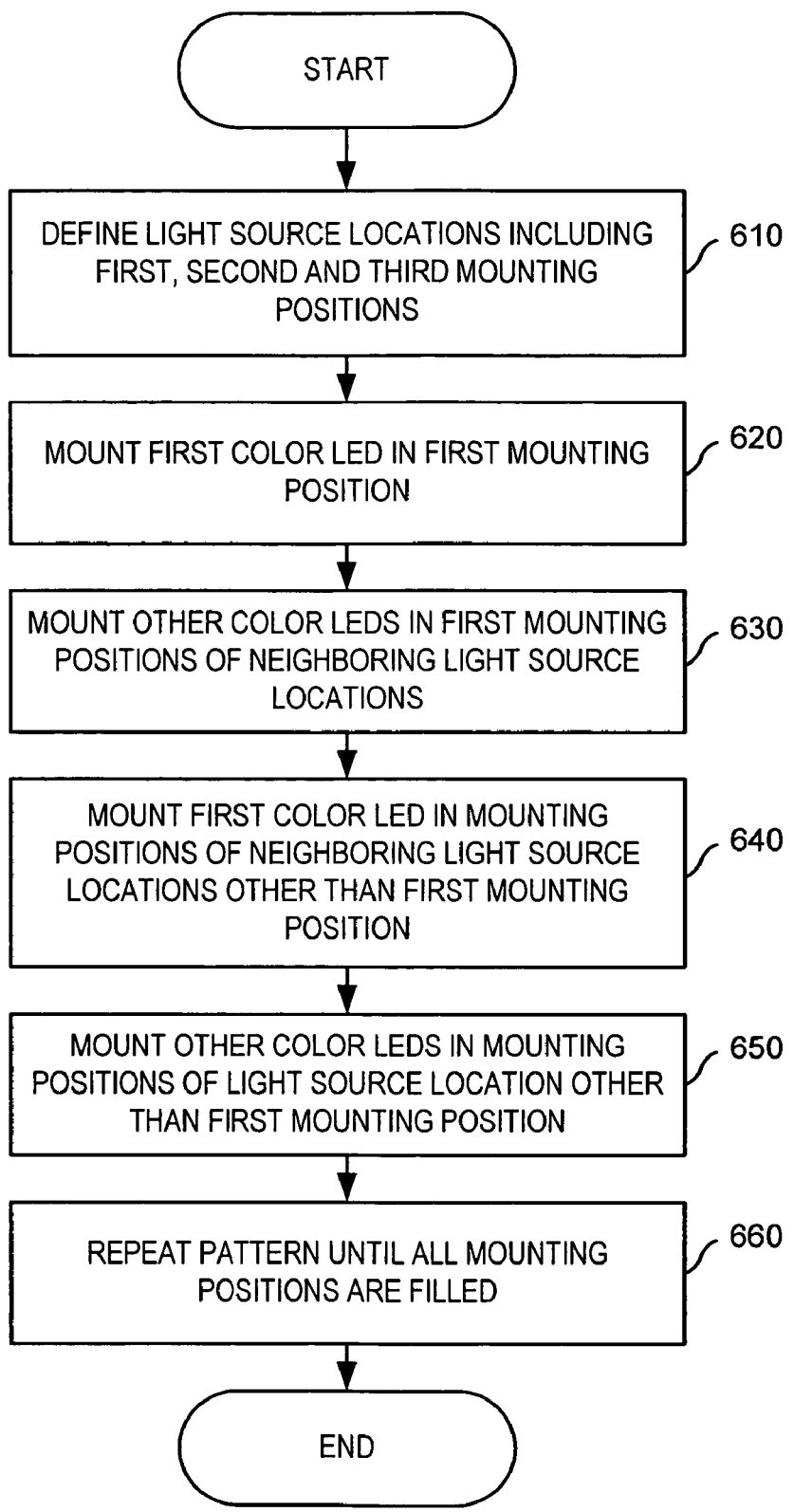
FIG. 11 is a flowchart illustrating operations according to some embodiments of the invention.

Methods of forming a solid state lighting tile are illustrated in FIG. 11. The methods include defining a plurality of light source locations on a tile (block 610). The light source locations may be arranged in an array of triangles on the tile. The light source locations include first, second and third die attach pads in first, second and third mounting positions, respectively. A first light emitting device configured to emit a first color of light is mounted in a first mounting position of a first light source location (block 620), and other color LEDs are mounted in the first mounting positions of light source locations neighboring the first light source location (block 630). In particular, a second light emitting device configured to emit a color of light different than the first color of light is mounted in the first mounting position of a second light source location neighboring the first light source location.

First color LEDs are mounted in mounting positions of neighboring light source locations other than the first mounting position (block 640. In particular, a third light emitting device configured to emit the first color of light is mounted in a mounting position of the second light source location other than the first mounting position. Other color LEDs are then mounted in mounting positions of the first light source location other than the first mounting position (block 650). The pattern may be repeated for each light source location until all mounting positions are filled (block 660).

Figure 12:
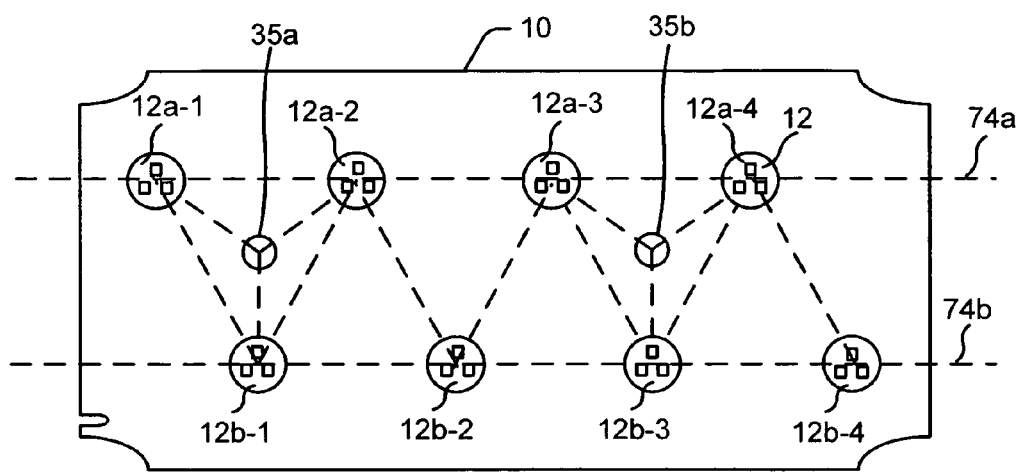
FIG. 12 is a top view of a solid state lighting tile in accordance with some embodiments of the invention.

Referring to FIG. 12, the retention holes 35a,b may be arranged to be as far away from lighting element clusters 12 as possible. The fasteners that are inserted in the retention holes 35a,b in order to fasten the reflector panel 40 may obstruct and/or absorb light emitted from the lighting element clusters 12. Accordingly, the retention holes 35a,b may be arranged near the center of a triangle formed by three adjacent lighting element clusters 12. For example, as shown in FIG. 12, a retention hole 35a is located at about the center of a triangle defined by lighting element clusters 12a-1, 12a-2 and 12b-1, while the retention hole 35b is located at about the center of a triangle defined by lighting element clusters 12a-3, 12a-4 and 12b-3. Thus, the retention holes 35a,b may be located about equidistant from a plurality of adjacent lighting element clusters 12.

Furthermore, the lighting element clusters 12 may be arranged in a pattern such that adjacent light sources form triangles, as shown in FIG. 12. In some embodiments, the triangles may be equilateral triangles. However, the triangles may be non-equilateral in some embodiments. The pitch distance (i.e. the spacing between adjacent light sources) may be set according to the dimensions of the desired application, such as the height between the tile 10 and a display screen being illuminated by the tile 10. If the pitch distance is too far apart, the light generated by the lighting element clusters 12 may not diffuse properly, and bright/dark spots may be visible. If the pitch distance is too close, the display may not be efficient.

Figure 13:
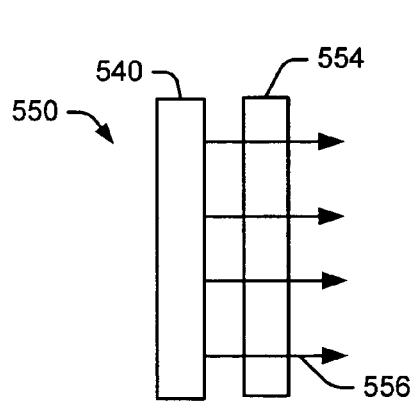
FIG. 13 is a side view of a liquid crystal diode display having a solid state backlight including a solid state lighting tile according to some embodiments of the invention.

Referring to FIG. 13, a lighting panel 540 including a plurality of tiles 10 according to some embodiments of the invention may be used as a backlight for a display such as a liquid crystal display (LCD) 550. Systems and methods for controlling solid state backlight panels are described, for example, in U.S. patent application Ser. No. 11/368,976, entitled "Adaptive Adjustment of Light Output of Solid State Lighting Panels", filed Mar. 6, 2006, which is assigned to the assignee of the present invention and the disclosure of which is incorporated herein by reference in its entirety. As shown in FIG. 13, an LCD 550 may include a lighting panel 540 that is positioned relative to an LCD screen 554 such that light 556 emitted by the lighting panel 540 passes through the LCD screen 554 to provide backlight for the LCD screen 554. The LCD screen 554 includes appropriately arranged shutters and associated filters that are configured to selectively pass/block a selected color of light 556 from the lighting panel 540 to generate a display image.

Figure 14:
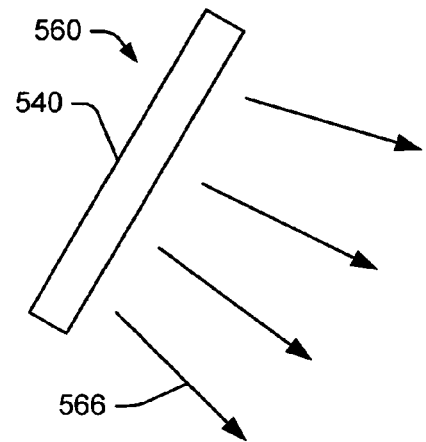
FIG. 14 is a solid state lighting panel including a solid state lighting tile according to some embodiments of the invention.

Referring to FIG. 14, a lighting panel 540 including a plurality of tiles 10 according to some embodiments of the invention may be used as a lighting panel for a solid state lighting fixture or luminaire 560. Light 566 emitted by the luminaire 560 may be used to illuminate an area and/or an object. Solid state luminaires are described, for example, in U.S. patent application Ser. No. 11/408,648, entitled "Solid State Luminaires for General Illumination", filed Apr. 21, 2006, which is assigned to the assignee of the present invention and the disclosure of which is incorporated herein by reference in its entirety.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A solid state lighting tile, comprising:
 a substrate;
 a plurality of lighting element clusters on a surface of the substrate, wherein respective ones of the plurality of lighting element clusters include first, second and third mounting positions configured to receive solid state light emitting devices;
 a plurality of first solid state light emitting devices configured to emit a first color light, a plurality of second solid state light emitting devices configured to emit a second color light, and a plurality of third solid state light emitting devices configured to emit a third color light, wherein respective ones of the first, second and third solid state light emitting devices are mounted in respective ones of the plurality of lighting element clusters so that respective ones of the lighting element clusters include a first solid state light emitting device, a second solid state light emitting device, and a third solid state light emitting device,
 wherein the plurality of lighting element clusters are provided in first and second lines of lighting element clusters including a first lighting element cluster in the first line of lighting element clusters and second and third lighting element clusters adjacent one another in the second line of lighting element clusters, the first, second and third neighboring lighting element clusters defining a triangular region therebetween;

wherein the first solid state lighting devices in the first line of lighting element clusters are connected in a first series electrical connection to form a first string, the second solid state lighting devices in the first line of lighting element clusters are connected in a second series electrical connection to form a second string, and the third solid state lighting devices in the first line of lighting element clusters are connected in a third series electrical connection to form a third string; and wherein the lighting element clusters are configured such that the mounting positions of respective first, second and third light emitting devices in one of the first, second and third lighting element clusters are not repeated in others of the first, second and third lighting element clusters.

2. The solid state lighting tile of claim 1, wherein the first mounting position of a lighting element cluster is rotationally offset from the second mounting position of the lighting element cluster relative to a center of the lighting element cluster.

3. The solid state lighting tile of claim 2, wherein the third mounting position of the lighting element cluster is rotationally offset from the first and second mounting positions relative to the center of the lighting element cluster.

4. The solid state lighting tile of claim 1, wherein the plurality of lighting element clusters comprise a first group of lighting element clusters arranged along a first line and a second group of lighting element clusters arranged along a second line that is parallel to the first line, wherein the second group of lighting element clusters is laterally offset from the first group of lighting element clusters.

5. The solid state lighting tile of claim 4, wherein the second group of lighting element clusters is offset from the first group of lighting element clusters by a distance d that is about half the spacing between adjacent ones of the lighting element clusters in the first group of lighting element clusters.

6. The solid state lighting tile of claim 4, wherein respective first, second and third mounting positions in neighboring lighting element clusters in the first line are rotationally offset from one another by one mounting position in a clockwise direction relative to centers of the respective lighting element clusters, and respective first, second and third mounting positions in neighboring lighting element clusters in the second line are rotationally offset from one another by one mounting position in a counterclockwise direction relative to centers of the respective lighting element clusters.

7. A backlight for an LCD display including a solid state lighting tile as recited in claim 1.

8. A solid state luminaire including a solid state lighting tile as recited in claim 1.

9. The solid state lighting tile of claim 1, wherein respective first, second and third mounting positions in the first lighting element cluster are rotationally offset from respective first, second and third mounting positions in the second lighting element cluster by one mounting position in a clockwise direction relative to centers of the respective lighting element clusters, and respective first, second and third mounting positions in the first lighting element cluster are rotationally offset from respective first, second and third mounting positions in the third lighting element cluster by one mounting position in a counterclockwise direction relative to centers of the respective lighting element clusters.

10. The solid state lighting tile of claim 1, wherein mounting positions of respective first, second and third solid state lighting devices in the second lighting element cluster are rotationally offset relative to mounting positions of respective first, second and third solid state lighting devices in the third lighting element cluster.

11. The solid state lighting tile of claim 1, wherein the first, second and third lighting element clusters are arranged in an equilateral triangle.

12. The solid state lighting tile of claim 11, further comprising a retention hole in the substrate, wherein the retention hole is positioned at the center of the equilateral triangle defined by the first, second and third lighting element clusters.

13. The solid state lighting tile of claim 1, wherein each of the lighting element clusters comprises a dielectric substrate, a plurality of die attach pads on the dielectric substrate wherein the solid state lighting devices comprise light emitting diodes mounted on the die attach pads, a solder mask on the dielectric substrate including an opening exposing the die attach pads, and an encapsulant dome covering the die attach pads and the solid state lighting devices and extending onto the solder mask.

14. The solid state lighting tile of claim 1, wherein each of the lighting element clusters comprises a dielectric substrate, a plurality of die attach pads on the dielectric substrate, and a plurality of wirebond pads on the substrate, wherein die attach pads in the second lighting element cluster are electrically coupled by parallel traces to the wirebond pads in the third lighting element cluster.

15. The solid state lighting tile of claim 1, wherein each of the lighting element clusters comprises a dielectric substrate, a plurality of die attach pads on the dielectric substrate, and a plurality of wirebond pads on the substrate, wherein die attach pads in respective ones of the lighting element clusters are coupled via electrical traces to respective wirebond pads in lighting element clusters adjacent to the respective lighting element clusters.

16. The solid state lighting tile of claim 1, wherein mounting positions of respective first, second and third solid state lighting devices in the first lighting element cluster are rotationally offset relative to mounting positions of respective first, second and third solid state lighting devices in the second lighting element cluster and respective first, second and third solid state lighting devices in the third lighting element cluster.

17. The solid state lighting tile of claim 1, wherein the first solid state lighting devices in the first string of lighting element clusters are configured to be driven by a first common current signal, the second solid state lighting devices in the first string of lighting element clusters are configured to be driven by a second common current signal, and the third solid state lighting devices in the first string of lighting element clusters are configured to be driven by a third common current signal.

18. The solid state lighting tile of claim 1, wherein the triangular region defined by the first, second and third neighboring lighting element clusters is free of light emitting devices.

19. The solid state lighting tile of claim 1, wherein the first, second and third strings include respective first, second and third anode contacts at a first end of the tile and respective first, second and third cathode contacts at a second end of the tile opposite the first end of the tile.

20. A solid state lighting tile, comprising:
a plurality of lighting element clusters on a surface of the tile, each of which is configured to receive a plurality of different color LEDs, wherein at least two of the lighting element clusters are configured to receive the different color LEDs at different mounting positions therein;

wherein the plurality of lighting element clusters are provided in first and second lines of lighting element clusters and wherein a first lighting element cluster is in the first line of lighting element clusters and wherein second and third lighting element clusters are adjacent one another in the second line of lighting element clusters;

wherein the plurality of lighting element clusters comprise first, second and third neighboring lighting element clusters that define a triangular region therebetween; and wherein mounting positions of respective first, second and third different colored solid state lighting devices in the first lighting element cluster are rotationally offset relative to mounting positions of respective first, second and third different colored solid state lighting devices in the second lighting element cluster and respective first, second and third different colored solid state lighting devices in the third lighting element cluster; and wherein first colored solid state lighting devices in the second and third lighting element clusters are connected in a first series electrical connection to form a first string, second colored solid state lighting devices in the second and third lighting element clusters are connected in a second series electrical connection to form a second string, and third colored solid state lighting devices in the second and third lighting element clusters are connected in a third series electrical connection to form a third string.

21. The solid state lighting tile of claim 20, each of the lighting element clusters include first and second mounting positions, wherein the first mounting position of a lighting element cluster is rotationally offset from the second mounting position of the lighting element cluster relative to a center of the lighting element cluster.

22. The solid state lighting tile of claim 21, wherein each of the lighting element clusters includes a third mounting position configured to receive a solid state light emitting device, and wherein the third mounting position of the lighting element cluster is rotationally offset from the first and second mounting positions relative to the center of the lighting element cluster.

23. The solid state lighting tile of claim 20, wherein the triangular region defined by the first, second and third neighboring lighting element clusters is free of light emitting devices.

24. The solid state lighting tile of claim 20, wherein the first, second and third strings include respective first, second and third anode contacts at a first end of the tile and respective first, second and third cathode contacts at a second end of the tile opposite the first end of the tile.

* * * * *